(12) United States Patent
Marvin et al.

(10) Patent No.: US 6,641,410 B2
(45) Date of Patent: Nov. 4, 2003

(54) ELECTRICAL SOLDER BALL CONTACT

(75) Inventors: Edward G. Marvin, New Castle, NH (US); David M. McNamara, Amherst, NH (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/877,920

(22) Filed: Jun. 7, 2001

(65) Prior Publication Data

US 2002/0187688 A1 Dec. 12, 2002

(51) Int. Cl.[7] ............................................... H01R 12/00
(52) U.S. Cl. ........................ 439/83; 439/886; 439/874
(58) Field of Search ........................... 439/862, 83, 886, 439/874–877; 200/267, 268, 266, 265

(56) References Cited

U.S. PATENT DOCUMENTS

| 3,915,546 | A |   | 10/1975 | Cobaugh et al. ......... 339/275 B |
| 4,663,815 | A |   | 5/1987 | Hartman et al. .............. 29/839 |
| 4,767,344 | A |   | 8/1988 | Noschese ..................... 439/83 |
| 5,052,936 | A |   | 10/1991 | Biechler et al. .............. 439/60 |
| 5,316,507 | A | * | 5/1994 | Capp ........................... 439/886 |
| 5,909,011 | A | * | 6/1999 | Chartrand et al. ............ 439/83 |
| 5,924,899 | A |   | 7/1999 | Paagman |
| 6,024,584 | A |   | 2/2000 | Lemke et al. |
| 6,039,616 | A | * | 3/2000 | Pereira et al. ................ 439/83 |
| 6,079,991 | A |   | 6/2000 | Lemke et al. |
| 6,093,035 | A |   | 7/2000 | Lemke et al. ................. 439/83 |
| 6,102,747 | A |   | 8/2000 | Paagman |
| 6,139,336 | A |   | 10/2000 | Olson |
| 6,146,203 | A |   | 11/2000 | Elco et al. |
| 6,152,747 | A |   | 11/2000 | McNamara |
| 6,164,983 | A |   | 12/2000 | Lemke et al. |
| 6,171,149 | B1 |   | 1/2001 | Van Zanten |
| 6,247,635 | B1 |   | 6/2001 | Olson .......................... 228/118 |
| 6,261,136 | B1 | * | 7/2001 | Dennis ......................... 439/83 |

* cited by examiner

*Primary Examiner*—Renee Luebke
*Assistant Examiner*—Felix O. Figueroa
(74) *Attorney, Agent, or Firm*—Daly, Crowley &Mofford, LLP

(57) ABSTRACT

An electrical contact including a contact end having a gold-plated surface for receiving a solder ball and edge surfaces adjacent to the gold surface for containing the solder ball on the gold-plated surface. In one embodiment, the contact end is connected to a curved lead and a portion of the contact end adjacent to the curved lead is comprised a less solder-wettable material than gold. A method of fabricating the electrical contact includes plating a metal sheet with a gold stripe and stamping the sheet to provide the contact surface in the gold stripe. Also described is an electrical connector having a plurality of conductive contacts, each having a gold-coated surface for receiving a solder ball and less solder-wettable edge surfaces adjacent to the gold surface.

15 Claims, 8 Drawing Sheets

ELECTRICAL SOLDER BALL CONTACT

CROSS-REFERENCE TO RELATED APPLICATIONS

Not applicable.

STATEMENTS REGARDING FEDERALLY SPONSORED RESEARCH

Not applicable.

1. Field of the Invention

This invention relates generally to conductive contacts for electrical components and more particularly to electrical contacts adapted to receive solder balls.

2. Background of the Invention

Modem electronics require reliable, low profile, high density electrical interconnections. One technique used to connect integrated circuits and other electronic components to a substrate, such as a printed circuit board, utilizes conductive spheres in the form of solder balls. For example, integrated circuits using ball grid array (BGA) technology include an array of solder balls attached to conductive pads on the bottom of the package. During manufacture of the integrated circuit, a solder reflow process is used to attach the solder balls to the conductive pads on the package which are sometimes coated with a solder wettable material such as gold or tin/lead. For example, gold is plated onto a copper base metal in a Tessera μBGA® package, as described in "Placement and Reflow of 0.3 mm Diameter Solder Balls for Chip-Scale μBGA® Devices," Chip Scale Review, Dec. 1997, pages 28–35. A further solder reflow process is used attach the solder balls on the component package to conductive pads on the printed circuit board.

Some electronic components which utilize solder ball connections include electrically conductive contacts or conductors, each having a contact end for receiving a solder ball. One such component is an electrical connector, as described in U.S. Pat. No. 6,152,747 entitled ELECTRICAL CONNECTOR. A portion of a solder ball contact 10 of the type described in U.S. Pat. No. 6,152,747 is shown in FIG. 1 to include a solder ball contact end 18 coupled to an elongated portion 14 by a curved interconnect 16. A further contact end (not shown) is provided at a second end of the elongated portion 14 for electrically interconnecting to a further component.

In manufacture, a solder ball 20 is positioned on the contact end 18, which may be dimpled to provide a concave surface, and a reflow process is used to melt the solder ball, causing the solder ball to adhere to the contact end. Ideally, the solder ball 20 is positioned in the center of the contact end, as shown by the dotted solder ball outline 22. However, during the reflow process, solder may flow beyond the contact end 18, as shown by the solid solder ball outline 24. This phenomena can result in the solder balls of adjacent contacts having different heights, thereby impairing the reliability of the resulting interconnections. Further, because the solder balls are not precisely located relative to the contact end 18, interconnection density and/or reliability may be adversely impacted.

A U.S. Pat. No. 6,079,991 entitled METHOD FOR PLACING CONTACT ON ELECTRICAL CONNECTOR describes an electrical connector having a solder ball mounting interface with high coplanarity. The connector includes contacts secured to an insulative housing having recesses into which a portion of a respective contact extends. A controlled volume of solder paste and a solder ball are positioned in each recess. The structure is then heated, causing the solder paste and solder ball to fuse to the contact end extending into the recess. The recesses are substantially uniform in size and shape and can receive a highly uniform amount of solder paste. Also, the recesses locate the position of each solder ball in the X, Y, and Z directions. A contact tab area which includes, but extends beyond, the contact end to which a solder ball is attached, is plated with a solder receptive material such as gold, tin or tin alloys. Solder resist areas are provided on central portions of the contacts to prevent solder wicking.

Electrical contacts having contact ends in the form of pins for soldering or press-fit attachment to plated vias of a printed circuit board or contact tails for surface mount attachment to conductive pads of a printed circuit board are sometimes coated with gold in order to prevent an oxide build up. Oxide has an insulative effect and thus, degrades contact performance. Further, gold advantageously reduces contact resistance.

SUMMARY OF THE INVENTION

It is an object of the invention to provide an electrical contact having a contact end for receiving a solder ball at a precise, predetermined position.

It is a further object of the invention to provide an electrical component having a plurality of solder ball contacts with the solder balls being at a substantially uniform height with respect to the component.

The foregoing and other objects are achieved with an electrical contact having an elongated portion and a contact end coupled to the elongated portion. The contact end has a contact surface adapted to receive a conductive sphere, such as a solder ball, and edge surfaces adjacent to the contact surface adapted to contain the solder ball on the contact surface. The contact surface is comprised of a solder-wettable material and the edge surfaces contain the solder ball in place by mechanical and/or material characteristics. In one embodiment, an edge surface of the contact end adjacent to the elongated portion of the contact is comprised of a less solder-wettable material.

Suitable materials for the contact surface include gold, palladium, and tin/lead alloys and suitable materials for the edge surfaces include copper alloys and nickel. In a preferred embodiment, the contact surface is gold and the edge surfaces are beryllium copper.

With this arrangement, the solder ball adheres to the contact surface and not to the adjacent edge surfaces, resulting in precise alignment of the solder ball relative to the contact. For electrical components having an array of such contacts, this precise alignment results in the solder balls being at a substantially uniform height and more reliable spacing between adjacent solder balls as is particularly important in high density components.

Also described is an electrical contact having a curved lead and a contact end connected to the curved lead. The contact end has a surface comprising a first region of a relatively high solder wettability and a second region of a lower solder wettability adjacent to the curved lead.

An electrical connector according to the invention includes a plurality of contacts, each having an intermediate portion, a first contact end at a first end of the intermediate portion, and a second contact end at a second end of the intermediate portion. The first contact end has a gold surface adapted to receive a solder ball and an edge surface adjacent to the gold surface comprised of a less solder-wettable material than gold. An insulative housing supports the contacts.

A method of fabricating a conductive contact having a contact end adapted to receive a conductive sphere includes plating a sheet of metal with at least one stripe of a solder-wettable material and stamping the plated sheet to define at least a portion of the contact end in the gold stripe. Since the metal sheet is plated and then the contact end is stamped, edge surfaces of the contact end orthogonal to the contact surface are not plated. These edge surfaces are comprised of the contact metal, such as beryllium copper, which is less solder-wettable than gold.

BRIEF DESCRIPTION OF THE DRAWINGS

The foregoing features of this invention, as well as the invention itself, may be more fully understood from the following description of the drawings in which.

DESCRIPTION OF THE PREFERRED EMBODIMENT

Figure 1:
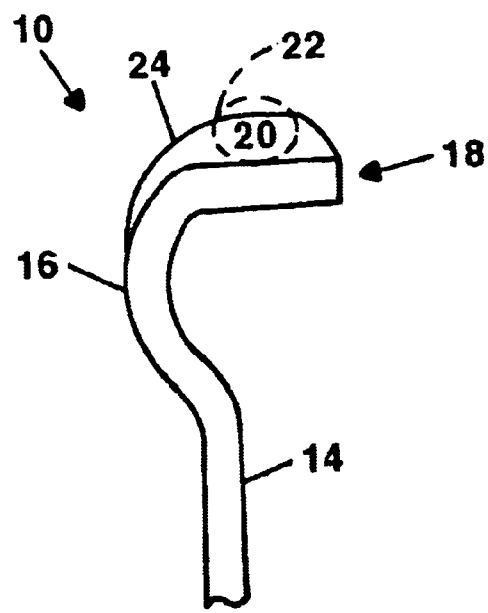
FIG. 1 shows a portion of a conventional electrical solder ball contact.
Figure 2:
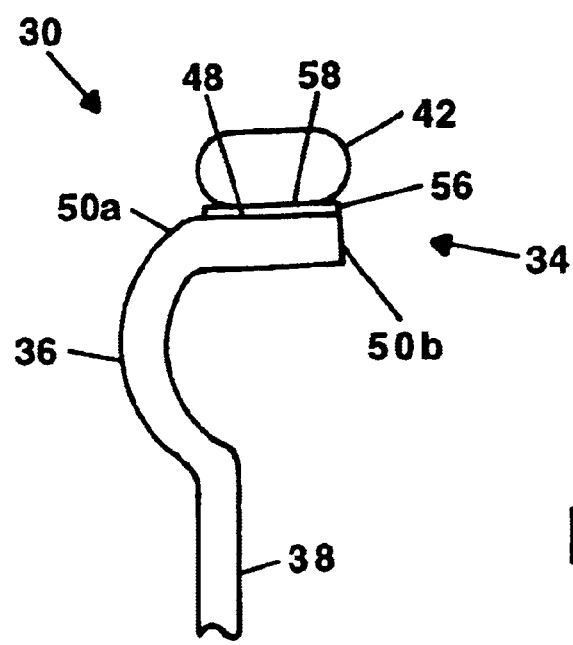
FIG. 2 shows a portion of an electrical solder ball contact according to the invention.

Referring to FIG. 2, an electrically conductive contact, or conductor 30 has a contact end 34 adapted for receiving a conductive sphere in the form of a solder ball 42 and an elongated portion 38 coupled to the contact end by a curved interconnect 36. The contact end 34 has a surface 48 extending substantially orthogonally with respect to the elongated portion and may be referred to as a contact pad.

According to the invention, the contact end 34 is provided with a contact surface 58 comprised of a solder-wettable material and is adapted to receive a solder ball 42. Edge surfaces 50a, 50b adjacent to the contact surface 58 are adapted to contain said solder ball on the contact surface.

In the embodiment of FIG. 2, the contact end surface 48 is plated with a layer 56 of a highly solder-wettable material to provide the contact surface 58. In a preferred embodiment, the layer 56 is comprised of gold. Other materials having suitable solder-wettability to provide the contact surface 58 include palladium, tin/lead alloys, and silver.

It is desirable to have the gold layer 56 be thin in order to minimize the cost associated with the gold and also to prevent gold embrittlement. Embrittlement refers to the formation and propagation of cracks, as may be caused by the non-ductile metal alloy grains of the solder ball formed by the gold dissolving into the solder. In the illustrative embodiment, the layer 56 has a thickness on the order of 3 microinches (0.08 micrometers) to 12 microinches (0.30 micrometers). In the illustrative embodiment, electroplating is the preferred method for applying the gold layer 56. However, it will be appreciated by those of ordinary skill in the art that alternative techniques may be used for applying the gold layer.

As will be described in connection with a contact manufacturing technique illustrated in FIGS. 5–5B, it is desirable that the gold layer 56 be precisely located with respect to the contact end 34. This is because the precision with which the layer 56 is located relative to the contact end 34 dictates the precision with which the solder ball 42 is located relative to the contact end.

Edge surfaces of the contact end 34 adjacent to the solder ball contact surface 58 which are adapted to contain the solder ball in place on the contact surface include edge surfaces 50a of the contact end adjacent to the curved interconnect 36 and sides 50b of the contact end 34 substantially orthogonal to the contact surface 58. This containment may be achieved by the mechanical and/or material aspects of the edge surfaces 50a, 50b.

In the illustrative embodiment, it is the relatively sharp edge between the contact surface 58 and the orthogonal edge surfaces 50b that contains the solder ball 42 over the contact surface 58. This is because the surface tension at the edge tends to keep the solder ball from sliding over the edge.

In order to prevent the solder ball from sliding down the curved interconnect 36, the edge surface 50a of the contact end adjacent to the curved interconnect 36 is comprised of a material which is less solder-wettable than the material of the layer 56 and, in some cases, the material of the edge surfaces may be substantially non-solder-wettable. Illustrative less solder-wettable materials include copper alloys such as beryllium copper, nickel, solder resists or masks, an epoxy coating used on printed circuit boards, and aluminum. In a preferred embodiment, the edge surface 50a of the contact end adjacent to the curved interconnect 36 is coated with nickel, as will be described in connection with the manufacture technique illustrated in FIGS. 5–5B.

During manufacture, solder flux or solder paste is applied to the surface 58 of the gold layer 56, the solder ball 42 is placed over the solder flux or solder paste, and the structure is heated to a temperature sufficient to reflow the solder. Preferably, the solder ball 42 contains a predetermined, precisely controlled volume of solder which enhances the planarity of the solder ball array on the resulting device. It will be appreciated by those of ordinary skill in the art that providing the solder ball with a precisely controlled volume may be achieved by various techniques, such as may be performed during manufacture of the individual solder balls and/or by techniques for placing the solder ball onto the contact end surface 58.

Solder paste or solder flux is applied to the contact surface 58 in order to hold the solder ball in place prior to soldering. The solder reflow process causes the solder ball 42 to become securely attached to the gold surface 58 and not to the adjacent edge surfaces 50a, 50b. Because the solder ball 42 adheres only to the gold surface 58 and because the gold layer 56 is precisely located relative to the contact end 34, the solder ball likewise is precisely located relative to the contact end 34.

The solder reflow process further causes at least some of the gold of layer 56 to dissolve into the solder ball. As a result, once the solder ball 42 is attached to the contact surface 58, there is not a clear boundary between the gold and solder. Rather, there is a gradient associated with the transition from gold to solder as you move from the contact end surface 56 through the solder ball. Thus, the contact end 34 can be described as supporting a solder ball structure having region adjacent to the contact end where there is a high concentration of gold. Stated differently, the gold layer 56 can be described as including a region of the solder ball where there is an alloy with a high concentration of gold.

According to a further embodiment, the solder-wettable material providing the contact surface 58 can be comprised of the copper material of the contact activated by solder flux which removes oxides. In this embodiment, the edge surfaces adjacent to the contact surface 58 are provided by a less-wettable material than the activated copper, such as non-activated copper, nickel, or other non-wettable or less-wettable coating.

In use, an electrical component including a plurality of the contacts 30 may be interconnected to a printed circuit board by conventional surface mount techniques. Illustrative components of this type are the connectors 102 and 104 of FIG. 3. More particularly, an array of solder balls on the component package is aligned with an array of conductive pads on the printed circuit board and a solder reflow process is used to attach the solder balls to the circuit board pads, thereby effecting electrical interconnection between the electrical component and the circuit board.

The precision alignment of the solder ball 42 relative to the contact end 34 achieved with the use of the gold layer 56 permits electrical components having an array of contacts 30 to have higher densities and more reliable interconnections. Further, the precision solder ball alignment causes the height of the solder balls relative to the component package to be substantially uniform, resulting in strong, reliable solder joints.

The contact 30 includes a second contact end (not shown) at a distal end of the elongated portion 38 for effecting electrical interconnection to a further component or printed circuit board. As one example, the second contact end may take the form of the beveled contact end, or tip 178 of the connector shown in FIG. 4 which is adapted for mating with a contact of another connector.

The size, shape and features of the contact 30, including the curved interconnect 36, the elongated portion 38, and the second contact end, may be modified to suit a particular application while still providing a contact which is within the scope of the invention. As one example, the contact end 34 may be dimpled with the gold layer 56 in contact with the concave surface of the dimple.

According to a manufacturing technique of the invention, a plurality of the contacts 30 are fabricated together, supported by a lead frame, as will be described in connection with FIGS. 5–5B. In general, and according to a preferred method of fabricating a contact 30, a metal sheet is plated with a stripe of a highly solder-wettable material, such as gold. Thereafter, the metal sheet is stamped to define at least a portion of the contact end 34 in the gold stripe. This particular arrangement results in the edge surfaces 50b of the contact end 34 being provided by the bare sheet metal, which is less solder-wettable than the gold layer 56.

Figure 3:
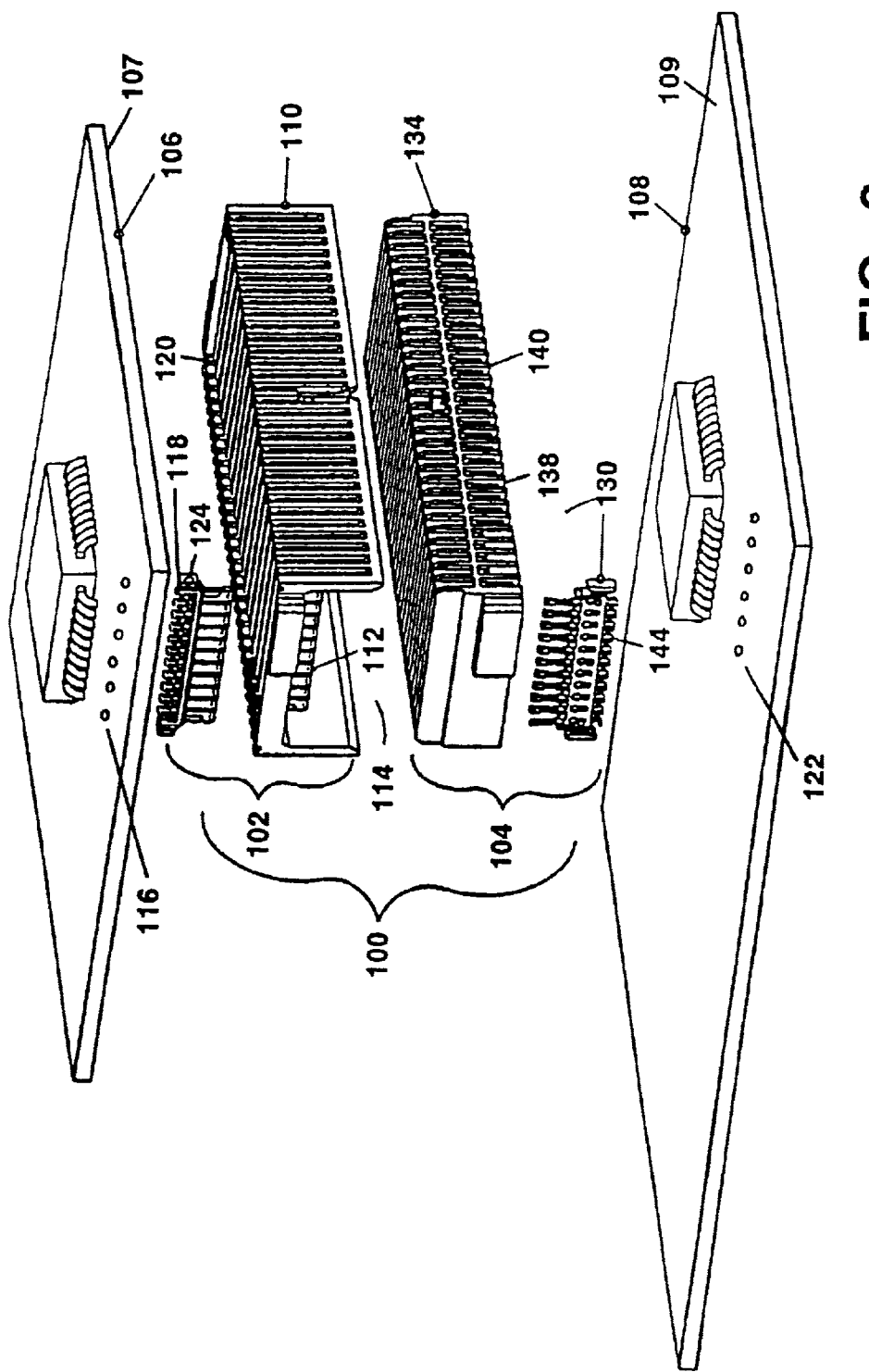
FIG. 3 is an exploded view of a pair of printed circuit boards electrically interconnected by a connector assembly including electrical solder ball contacts according to the invention.

Referring also to FIG. 3, an electrical connector assembly 100 includes first and second connectors 102, 104 adapted for interconnecting parallel circuit boards 106, 108. Each of the connectors 102, 104 contains a plurality of contacts of the type shown in FIG. 2. The connector assembly 100 is substantially similar in construction to a connector assembly 10 described in U.S. Pat. No. 6,152,747, entitled ELECTRICAL CONNECTOR, which patent is hereby incorporated herein in its entirety, with the significant exception of the contacts.

The connector 102 includes a dielectric housing 110 having a plurality of slots 112 in a surface 114. The connector 102 further includes a plurality of modules, or wafers 124, only one of which is shown for simplicity, and each supporting a plurality of solder ball contacts according to the invention, as will be described. Each of the slots 112 is adapted to receive a module 124 such that a termination portion 118 of each module including an array of solder balls extends beyond the surface 120 of the housing 110 for making electrical contact with conductive pads 116 on a bottom surface 107 of the circuit board 106. Modules 124 will be described further in connection with FIGS. 4–8.

The connector 104 includes a dielectric housing 134 having a plurality of slots 138 in a surface 140. The connector 104 further includes a plurality of modules 130, each supporting a plurality of solder ball contacts according to the invention and being positioned in a respective slot 138 of the housing 134. A termination portion 144 of the modules 130 including an array of solder balls extends beyond the surface 140 of the housing 134 for making electrical contact with an array of conductive pads 122 on the top surface 109 of the circuit board 108. Modules 130 will be described in connection with FIG. 9.

A first end of each contact supported by module 124 has a solder ball for connection to circuit board 106 and a first end of each contact supported by module 130 has a solder ball for connection to circuit board 108. Each of the modules 124, 130 includes a plurality of conductors, or contacts having a first contact end with a gold layer adapted to receive a solder ball. Second ends of the contacts of module 124 are adapted to contact second ends of the respective contacts of module 130 when the connectors 102, 104 are mated in assembly.

Figure 4:
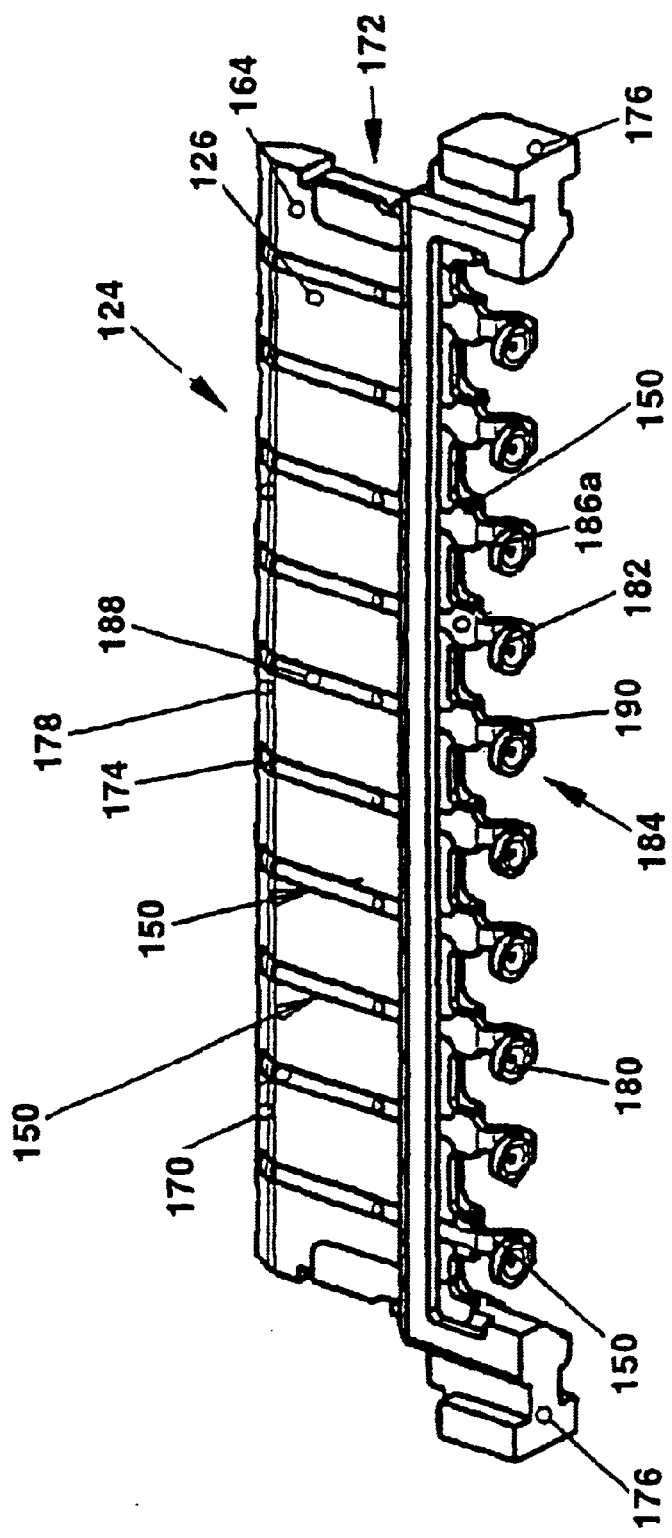
FIG. 4 is a perspective view of a portion of a module of the connector assembly of FIG. 3 with the shield removed.

Referring also to FIG. 4, module 124 includes a dielectric support 164 supporting a plurality of electrical contacts 150 configured in a linear array. The support 164 has substantially planar, opposing surfaces 126 and 128 (FIG. 6) and a beveled forward portion 170. Support portion 172 locates the support 164 within a respective slot 112 of the housing 110 (FIG. 3) and shoulder portions 176 locate the support within grooved ends of the respective slot.

Each of the contacts 150 has a first contact end 180 at a rearward end 184, a second contact end, or tip 174 at a forward end 178, and an elongated, intermediate portion 188 extending from the forward end to the rearward end. The first contact end 180 is substantially orthogonally oriented with respect to the intermediate portion 188 and is coupled to the intermediate portion by a resilient, curved and more specifically arch-shaped interconnect 190. The interconnect 190 is curved in order to ensure the mechanical integrity of the resulting interconnection of the contact to a circuit board by preventing cracking that might otherwise occur when there is thermal cycling after the contact is attached to the board. In assembly, the contacts 150 are partially embedded in the support 164, such as by insert molding.

Figure 8:
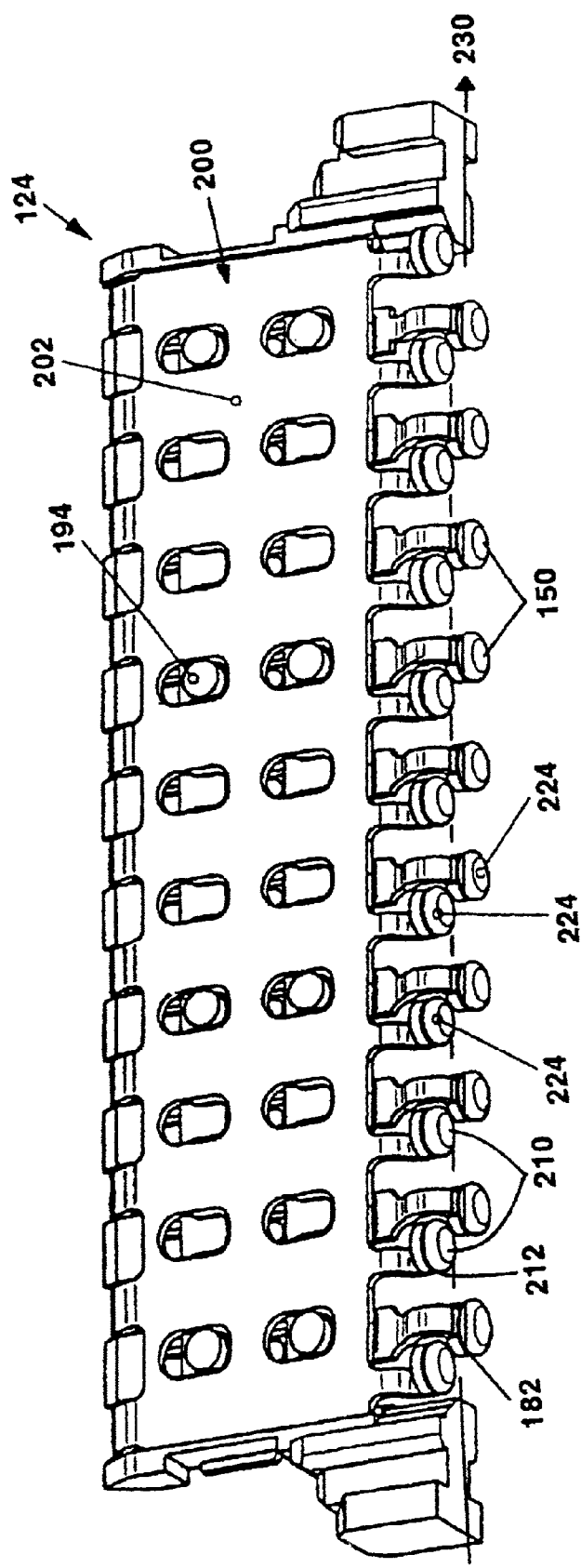
FIG. 8 is a perspective view of the assembled module of FIG. 4.

A layer 182 of a highly solder-wettable material, such as gold, is provided on a surface of the contact end 180 for receiving a solder ball 224 (FIG. 8). Edge surfaces 186 of the contact end 180 adjacent to the gold layer 182 are designed to contain the solder ball 224 on the gold layer 182, as may be achieved by mechanical and/or material characteristics. The second contact end 174 is angled at a complementary angle with respect to the beveled forward portion 170 of the support 164. The first contact end 180 may be dimpled to provide a concave surface over which the gold layer is applied, as shown.

Figure 5:
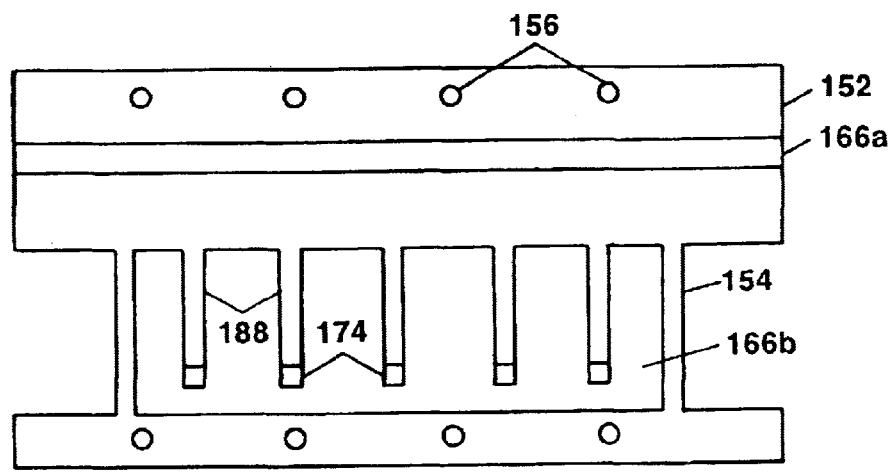
FIG. 5 is a plan view of a metal sheet from which contacts of the module of FIG. 4 are manufactured.
Figure 5A:
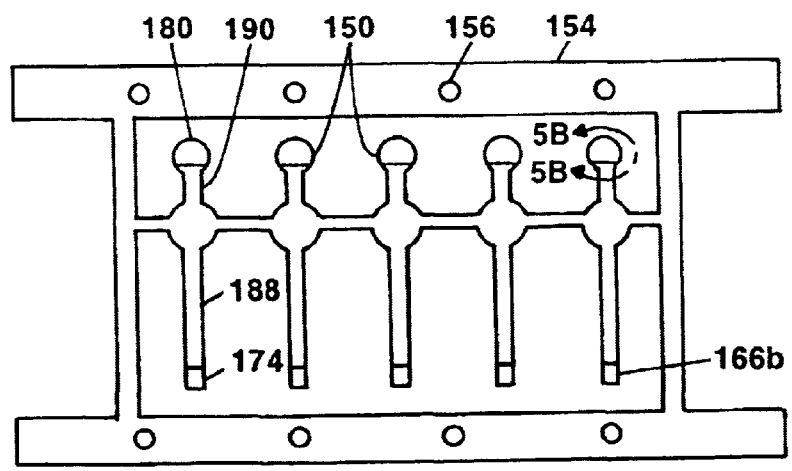
FIG. 5A is a plan view of a lead frame and contacts stamped from the metal sheet of FIG. 5.
Figure 5B:
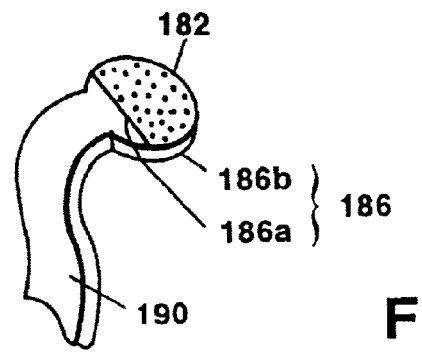
FIG. 5B is an enlarged view of a portion of a contact taken along line 5B—5B of FIG. 5A.

Referring also to FIGS. 5–5B, fabrication of the electrical contacts 150 will be described. A plurality of contacts 150 are fabricated from a metal sheet 152, such as a sheet of copper alloy like beryllium copper, brass, or phosphor bronze. The thickness of the sheet 152 is generally on the order of 0.006 inches (0.15 millimeters) to 0.025 inches (0.64 millimeters). The sheet 152 is blanked to provide alignment, or pilot holes 156 along its edges in order to facilitate accurate registration of features of the contact.

The metal sheet 152 is coated with nickel. The nickel forms a barrier layer between the metal sheet and the gold layer 182 on the contact end 180 and prevents oxidation. While it is preferable that the entire metal sheet be plated with nickel since masking to selectively apply nickel is expensive, it will be appreciated by those of ordinary skill in the art that, alternatively, the sheet can be selectively plated with nickel.

The metal sheet 152 is stamped and formed to provide a lead frame 154 and the intermediate portion 188 and mating contact tips 174 of the contacts 150, as shown. More particularly, the metal sheet is blanked, or cut, to define the lead frame and individual contacts and is formed to provide three-dimensional features of the contacts, such as the bevel of the contact tips 174.

The metal sheet 152 is then gold-plated to provide a gold stripe 166*a* at a predetermined position relative to the pilot holes 156. Gold stripe 166*a* forms the gold layer 182 on the contact pads 180. Preferably, the gold is 24 Karat and has a thickness on the order of 3–12 microinches (0.08–0.30 micrometers).

A further gold stripe 166*b* is plated to provide a gold coating on the mating contact tips 174. The gold strip 166*b* is comprised of nickel hardened gold and preferably has a thickness on the order of 30 microinches (0.76 micrometers). The manner by which the gold stripes are plated is by forming a mask with features that align with the pilot holes 156. The mask exposes the areas of the sheet where exposure to a solution with gold dissolved in it is desired.

Referring also to FIG. 5A, the contact ends 180 and curved interconnects 190 are defined in a further stamping process, with at least a portion of the contact ends 180 located in a gold stripe 166*a* to provide the gold layer 182 for receiving a solder ball. The contacts 150 are formed in order to provide a curve in the interconnect 190 and to bend the contact end 180 to be at a substantially 90 degree angle with respect to the elongated portion 188.

Referring also to the enlarged contact end 180 of FIG. 5B, edge surfaces 186 of the contact end 180 are designed to contain the solder ball to the gold layer 182. Edge surfaces 186 include surface portions 186*a* of the contact end adjacent to the curved interconnect 190 as well as surface portions 186*b* which are orthogonal to the gold-plated surface and are provided by cutting through the metal sheet 152. In the illustrative embodiment, approximately 67% of the contact end 180 is gold-plated with non-plated surface portions 186*a* being adjacent to the interconnect 190. Since the edge surfaces 186*a* are comprised of nickel which is less wettable than gold, the solder does not flow down the curved interconnect.

It will be appreciated by those of ordinary skill in the art that, generally, the stamping, forming and gold-plating steps illustrated in FIGS. 5 and 5A can be performed in any sequence. However, it may be preferable to apply the gold stripe 166*b* after the mating contact tips 174 are formed in order to prevent scratching the gold on the contact tips 174 during forming. Also, it is desirable to apply the gold stripe 166*a* prior to stamping the contact ends 180 so that the orthogonal edge surfaces 186*b* (FIG. 5B) of the contact end are not gold-plated, but rather are bare metal exposed as the metal sheet is cut. Since the contact metal is less solder-wettable than gold, these edge surfaces 186*b* form a barrier which prevents the solder from flowing beyond the gold layer 182. Further, these bare metal edge surfaces 186*b* become even more non-solder wettable upon exposure to air due to oxidation. Also, the surface tension caused by the edge of the contact end between the gold layer 182 and the surfaces 186*b* further helps prevent solder from flowing onto the edge surfaces 186*b*. This arrangement advantageously causes the solder ball (FIG. 8) to be precisely located on the gold surface 182.

While the above-described manufacturing process has advantages as described, it will be appreciated by those of ordinary skill in the art that other manufacturing processes may be suitable for fabricating the contacts 150. For example, a copper sheet may be stamped and formed, and then selectively gold-plated over the contact ends 180 to provide gold contact layers 182. Also, it will be appreciated that the blanking and forming steps may be performed in combined or individual process steps.

The stamped lead frame is embedded in support 164 (FIG. 4) by insert molding. In particular, part of the elongated portion 188 of each contact is embedded in the support. Following insert molding, portions of the lead frame coupled between adjacent contacts 150 are removed in order to electrically isolate the contacts.

Figure 6:
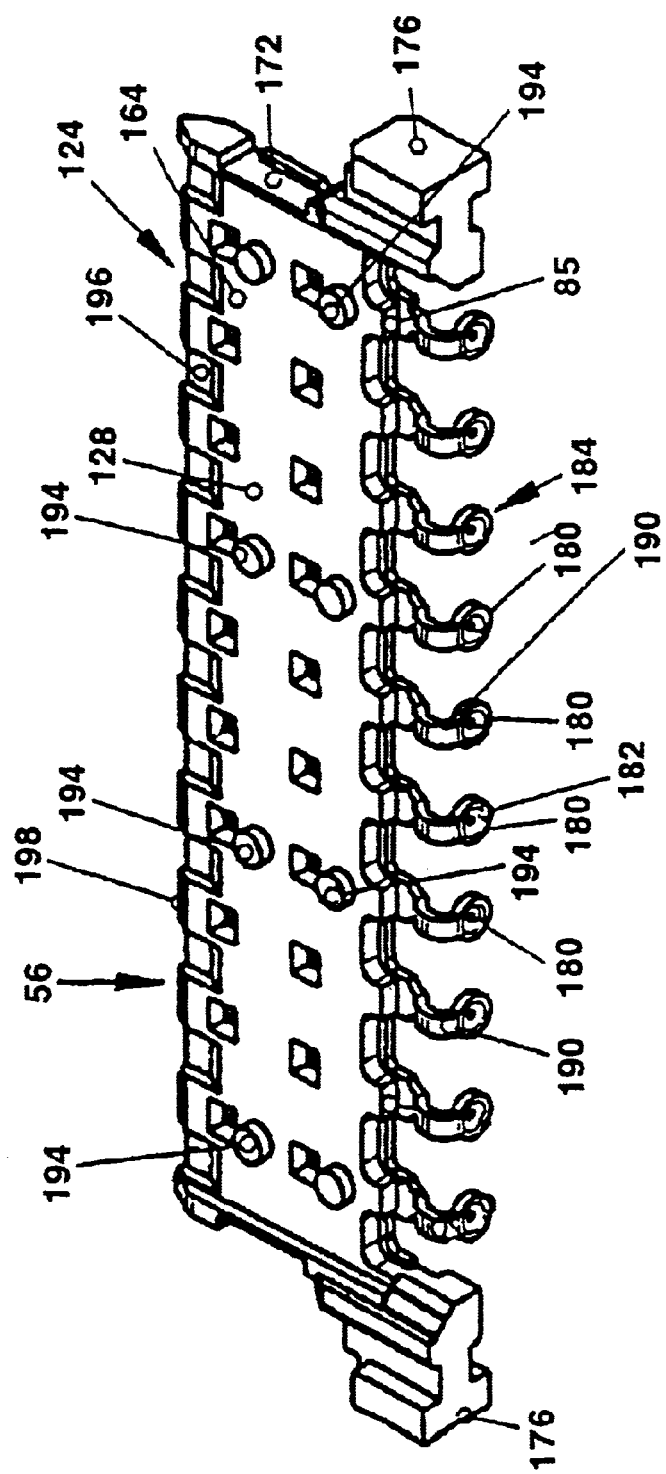
FIG. 6 is a different perspective view of the module of FIG. 4 with the shield removed.
Figure 7:
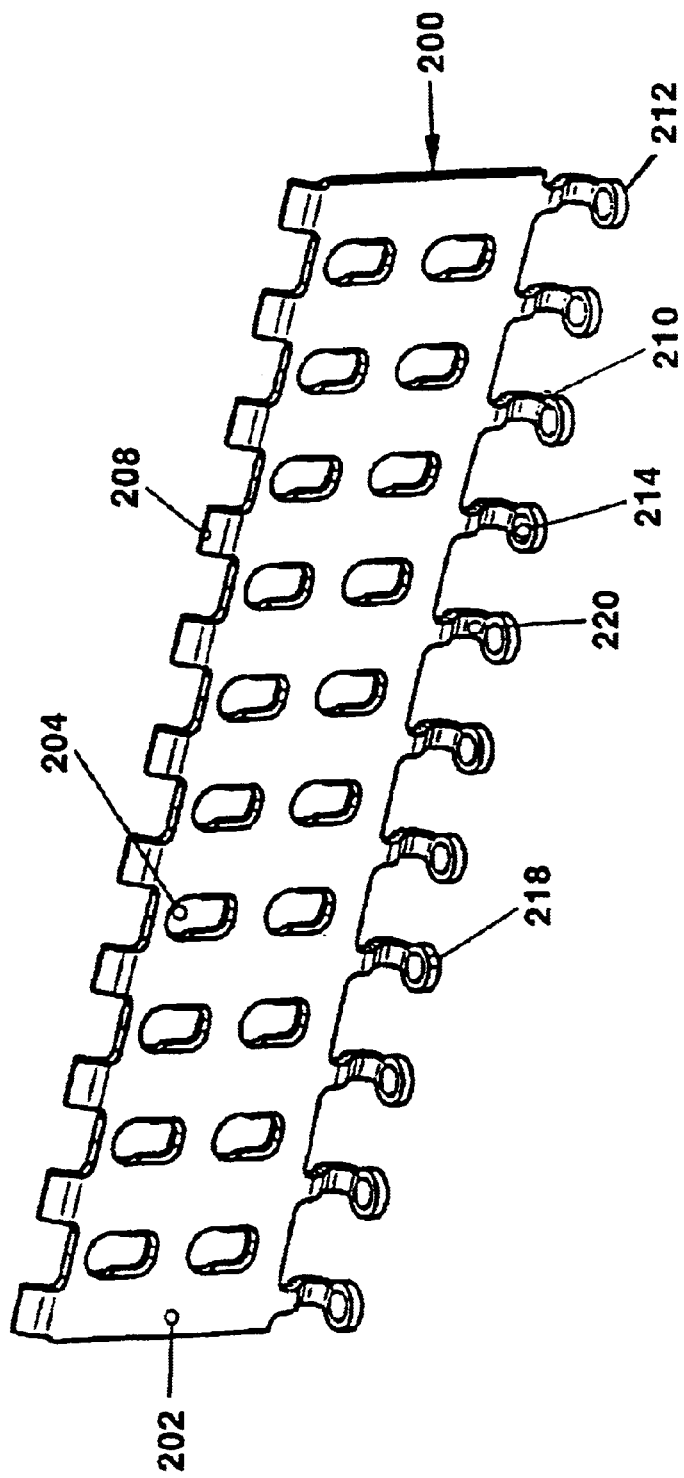
FIG. 7 is a perspective view of a shield for the module of FIG. 4.

Referring also to FIG. 6, an alternative view of the module 124 reveals a plurality of posts 194 extending from the support surface 128. Posts 194 are adapted to mate with an electrical shielding member 200 (FIG. 7). Beveled portions 198 of the support 164 are interleaved with recesses 196 in order to insulate the contacts 150 from the shielding member 200 in assembly.

Referring also to FIG. 7, the shielding member 200 includes a plurality of apertures 204 adapted for being press fit onto corresponding posts 194 extending from the support surface 128 (FIG. 6). The shielding member 200 is stamped and formed from a metal sheet, such as copper. Additional features of the shielding member include beveled portions 208 which are aligned with support recesses 196 (FIG. 6) and contact ends 210 which are substantially identical in construction to contact ends 180 of the signal contacts 150. That is, each contact end 210 is gold-plated to provide a gold layer 212 adapted to receive a solder ball 224 (FIG. 8) with which connection is made to the printed circuit board 106. An arch-shaped interconnect 220 resiliently suspends the contact end 210 in an orthogonal orientation with respect to the substantially planar surface 202 of the shielding member. The contact end 210 may be dimpled as shown, to provide a concave lower surface 214 for receiving the solder ball.

Referring also to FIG. 8, the assembled module 124 includes support 164 mated to shielding member 200. Also shown in FIG. 8 are solder balls 224 attached to the gold layer 182 on contact ends 180 of the signal contacts 150 and to the gold layer 212 on the contact ends 210 of the shielding member 200, as may be done by a solder reflow process. The solder balls 224 are resiliently suspended beyond the support 164 by curved interconnects 190 and 220. As is apparent from the view of FIG. 8, the signal contact ends 180 are interleaved with the shield contact ends 210 along an axis 230 and extend in opposite directions from the axis.

Figure 9:
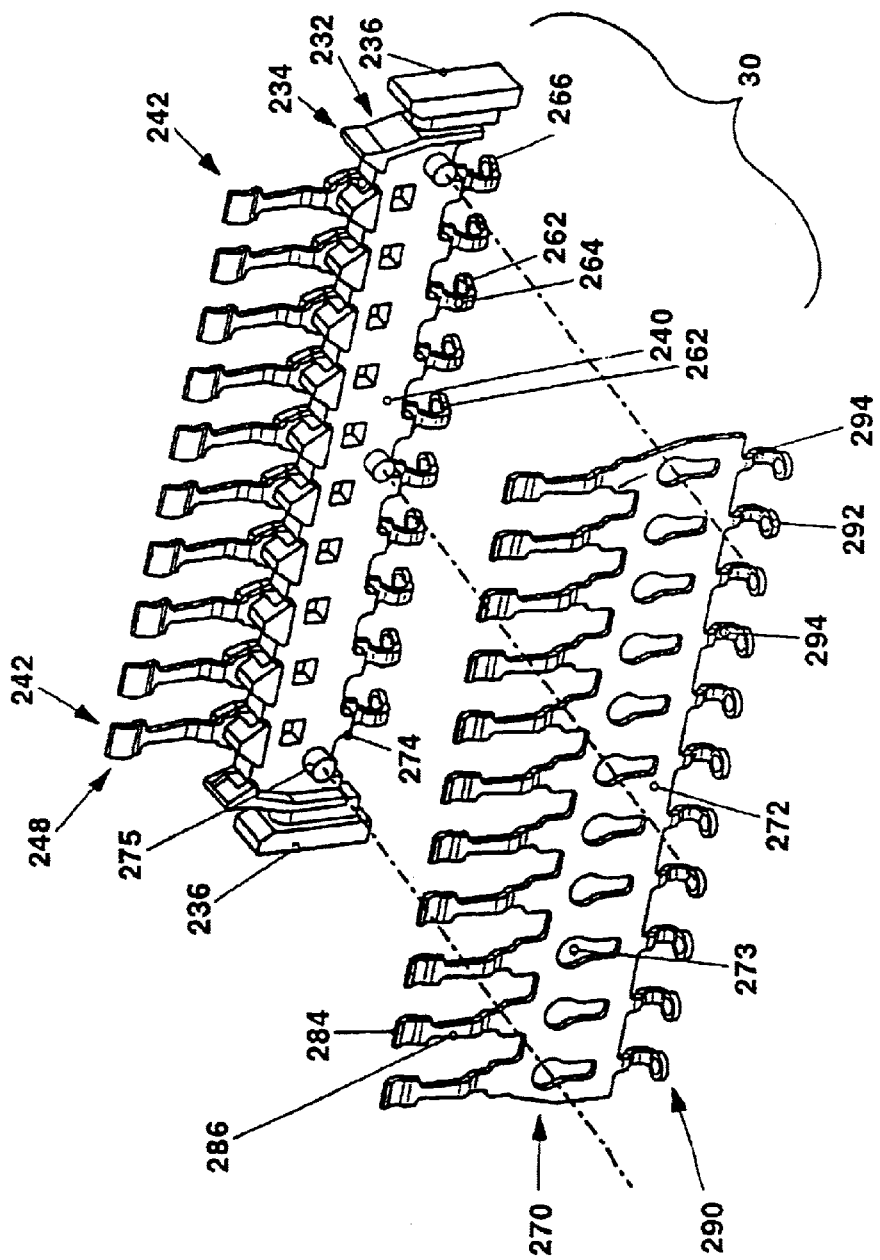
FIG. 9 is an exploded view of a further module of the connector assembly of FIG. 3.

Referring also to FIG. 9, an exemplary module 130 adapted to be received by a slot 138 of the support 134 (FIG. 3) includes a dielectric support 232 having a forward portion 234 and a pair of rearward, shoulder portions 236. The end portions 236 are configured to locate the support 232 in a respective groove 138 (FIG. 3). The forward portion 234 has substantially planar first and second opposing surfaces 240.

The module 130 includes a plurality of signal contacts 242 disposed in a linear array. Like the contacts 150 of the module 124, the contacts 242 are provided in a lead frame which is insert molded into the support 232. Once assembled, portions of the lead frame coupled between contacts 242 are removed in order to electrically isolate the contacts.

Each of the contacts 242 has a mating end 248 adapted to mate with the beveled contact end 174 of a respective contact 150. A portion 260 of the contacts 242 is embedded in the support 232. A contact end 262 is provided for receiving a solder ball and is resiliently suspended beyond the support 232 by interconnect 264. While the interconnect 264 is shown to be arch-shaped, providing the interconnect with any type of curved region is suitable. The reason to provide the interconnect with a curved region is in order give the contact the mechanical integrity necessary to avoid cracking when there is thermal cycling after the connector is attached to the board. The contact ends 262 are configured like the ends 180 of contacts 150 and thus, include a gold layer 266 for receiving a solder ball (not shown).

The module 130 includes an electrical shielding member 270 having a conductive ground plate 272 disposed on the surface 240 of the dielectric support 232. The plate 272 has holes 273 adapted for bring press-fit onto posts 275 projecting outwardly from the surface 240. The shielding member 270 includes a plurality of electrical reference potential conductors having contact ends 284 suspended from the plate by resilient interconnects 286. In use, the contact ends 284 are adapted to mate with the beveled ends of a corresponding shielding member 200 of a module 124.

The shielding member 270 also includes a plurality of reference potential conductors 290, each having a contact end 292 coupled to the plate by a resilient arch-shaped interconnect 294. Contact ends 292 are identical to contact ends 284 in construction and thus, include a gold-layer 296 adapted to receive a solder ball. The reference potential contact ends 292 are staggered with the signal contact ends 262 and extend in opposite directions from the intersection of the support 232 and the shielding member 270.

Having described the preferred embodiments of the invention, it will now become apparent to one of ordinary skill in the art that other embodiments incorporating their concepts may be used.

For example, it will be appreciated by those of ordinary skill in the art that the described contacts having a gold solder ball contact surface are suitable for a multitude of configurations and applications. Also, while the illustrative connectors 102, 104 are of the mezzanine type, in which the signal contacts extend straight through the modules 124, 130, respectively, it would be possible to make a right-angle type connector by bending the signal contacts and shield members 200, 270.

Also, it will be appreciated that the described electrical contact including a solder-wettable area on the contact end for receiving a solder ball and a less-solder-wettable area surrounding the wettable area may be provided by fabricating the contact from a highly wettable material, such as gold, and then selectively plating the contact to cover edge surfaces around the contact end with a less wettable material, such as nickel.

It is felt therefore that these embodiments should not be limited to disclosed embodiments but rather should be limited only by the spirit and scope of the appended claims. All publications and references cited herein are expressly incorporated herein by reference in their entirety.

What is claimed is:

1. An electrical contact comprising:
    an elongated portion;
    a contact end extending substantially orthogonally from said elongated portion, said contact end having a contact surface comprised of a relatively high solder wettability material and terminating at a sharp edge, said contact end further having edge surfaces adjacent to said contact surface and terminating at said sharp edge, wherein said edge surfaces are comprised of a lower solder wettability material; and
    a conductive sphere disposed on said contact surface.

2. The electrical contact of claim 1 wherein said relatively high solder wettability material is selected from: gold, palladium, and tin/lead alloy.

3. The electrical contact of claim 1 wherein said elongated portion has a curved portion adjacent to said contact end.

4. The electrical contact of claim 1 wherein said edge surfaces comprise sides of said contact end substantially orthogonal to said contact surface.

5. The electrical contact of claim 3 wherein said portion of said contact end adjacent to said curved portion is comprised of said lower solder wettability material.

6. The electrical contact of claim 5 wherein said lower solder wettability material is selected from a copper alloy and nickel.

7. The electrical contact of claim 1 wherein said contact surface is substantially orthogonal with respect to said elongated portion.

8. The electrical contact of claim 1 further comprising an insulative housing, wherein said elongated portion of said contact is affixed to said housing and said contact surface is suspended below said insulative housing.

9. An electrical contact comprising:
    a curved lead;
    a contact end extending substantially orthogonally from said curved lead, wherein said contact end has a surface comprising a first region of relatively high solder wettability and a second region of lower solder wettability adjacent to said curved lead; and
    a conductive sphere covering substantially the entire first region of said contact end surface.

10. The electrical contact of claim 10 wherein said first region is comprised of gold.

11. The electrical contact of claim 10 wherein said second region is comprised of nickel.

12. An electrical connector comprising:
    a plurality of contacts, each having an intermediate portion, a first contact end at a first end of said intermediate portion, and a second contact end at a second end of said intermediate portion, said first contact end extending substantially orthogonally from said intermediate portion and having a gold surface in only one plane on which a conductive sphere is disposed and an edge surface adjacent to said gold surface comprised of a material having less solder-wettability than gold; and
    an insulative housing supporting said plurality of contacts.

13. The electrical connector of claim 12 further comprising a conductive shield disposed parallel and adjacent to at least one of said plurality of contacts.

14. The electrical connector of claim 12 wherein said second contact end of each of said plurality of contacts is adapted for mating to a second electrical connector.

15. The electrical connector of claim 12 further comprising a plurality of conductive spheres, each attached to said gold surface of a respective one of said plurality of contacts.

* * * * *

UNITED STATES PATENT AND TRADEMARK OFFICE
CERTIFICATE OF CORRECTION

PATENT NO. : 6,641,410 B2
DATED : November 4, 2003
INVENTOR(S) : Edward G. Marvin et al.

It is certified that error appears in the above-identified patent and that said Letters Patent is hereby corrected as shown below:

<u>Column 1,</u>
Line 33, delete "attach" and replace with -- to attach --.

<u>Column 5,</u>
Line 2, delete "having region" and replace with -- having a region --.

<u>Column 7,</u>
Line 25, delete "gold strip" and replace with -- gold stripe --.

<u>Column 9,</u>
Line 9, delete "in order give" and replace with -- in order to give --.
Line 18, delete "for bring" and replace with -- for bringing --.

Signed and Sealed this

Fifteenth Day of June, 2004

JON W. DUDAS
*Acting Director of the United States Patent and Trademark Office*